(12) United States Patent
Ahmed et al.

(10) Patent No.: US 6,525,586 B1
(45) Date of Patent: Feb. 25, 2003

(54) PROGRAMMABLE DELAY ELEMENT USING DIFFERENTIAL TECHNIQUE

(75) Inventors: Abdullah Ahmed, Ontario (CA); Sami Bizzan, Ontario (CA); Lawrence A. Prather, Boulder Creek, CA (US)

(73) Assignee: Genesis Microchip, Inc., Ontario (CA)

( * ) Notice: Subject to any disclaimer, the term of this patent is extended or adjusted under 35 U.S.C. 154(b) by 0 days.

(21) Appl. No.: 09/986,640

(22) Filed: Nov. 9, 2001

(51) Int. Cl.$^7$ .............................................. H03H 11/26
(52) U.S. Cl. ...................................... 327/280; 327/287
(58) Field of Search ................................ 327/280, 270, 327/272, 274, 276, 281, 285, 287, 288

(56) References Cited

U.S. PATENT DOCUMENTS

| | | | | |
|---|---|---|---|---|
| 6,087,876 A | | 7/2000 | Barrow | 327/281 |
| 6,121,811 A | * | 9/2000 | Scott et al. | 327/276 |
| 6,124,745 A | * | 9/2000 | Hilton | 327/276 |
| 6,124,746 A | * | 9/2000 | Van Zalinge | 327/280 |
| 6,388,491 B1 | * | 5/2002 | Yamasaki et al. | 327/278 |

* cited by examiner

Primary Examiner—Timothy P. Callahan
Assistant Examiner—Linh Nguyen
(74) Attorney, Agent, or Firm—Staas & Halsey LLP (57) ABSTRACT

A programmable delay element is provided for delaying a digital input signal. The programmable delay element comprises a discharge capacitor adapted to be precharged to a predetermined voltage in response to a first transition of the digital input signal. A transistor switch of a first type is provided for precharging the discharge capacitor to a predetermined voltage. A discharge current source is connected via a sense node to the discharge capacitor for discharging the capacitor in response to a subsequent opposite transition of the digital input signal. A transistor switch of a second type is provided for connecting the discharge capacitor to the discharge current source and thereby discharging the discharge capacitor. A reference voltage source is provided for applying a reference voltage to a reference node. A comparator is provided having a first input connected to the sense node and a second input connected to the reference node, such that an output of the comparator generates a delayed version of the digital input signal such that the subsequent opposite transition is delayed by an amount equal to the time for the capacitor to discharge to a voltage equal to the reference voltage.

32 Claims, 5 Drawing Sheets

PROGRAMMABLE DELAY ELEMENT USING DIFFERENTIAL TECHNIQUE

FIELD OF THE INVENTION

This invention relates in general to time delay circuits, and more particularly to an electrical circuit for time delay of signals to an integrated circuit and having low sensitivity to changes in supply voltage and ambient temperature.

BACKGROUND OF THE INVENTION

Time delay circuits are widely used in digital and mixed signal chips for providing delay adjustments of clock signals in digital systems where speed is a critical factor. In mixed signal chips, for example, delay elements are used in analog to digital converters for sampling clock phase optimization, such as required when converting time-referenced analog signals (e.g. graphics and video signals). A digital display controller with analog interface satisfying the requirements for different display environments requires a circuit that provides a wide delay range with sub-gate delay steps. A specific display environment may require very fine delay steps whereas other display environments may require coarse steps in performing phase adjustments for the time reference signals. Furthermore, to achieve an acceptable display image, variation in absolute delay values, caused by variations in operating conditions, should be limited.

Time delay circuits have been implemented using inverter chain and RC-delay techniques as these techniques offer simple and easy solutions. These circuits suffer from many disadvantages, as the time delays are highly sensitive to operating conditions such as supply voltage and ambient temperature. Also, when such circuits are used in a noisy environment performance is degraded and consequently, display image quality is degraded. Attempts have been made to provide delay circuits using CMOS thyristors. Although such circuits exhibit improved sensitivity to environmental conditions, the sensitivity of the CMOS thyristors is still not acceptable for display image processing.

Other implementations of delay circuits, with improved performance characteristics generally involve complex designs using PLL or interpolation techniques in closed loop systems. These circuits suffer the disadvantages of consuming large area and static power when a wide delay range is required.

It is therefore desirable to provide a circuit for time delay of signals to an integrated circuit, which is characterized by low sensitivity to changes in supply voltage and ambient temperature.

SUMMARY OF THE INVENTION

In accordance with an aspect of the present invention, there is provided a programmable delay element for delaying a digital input signal, comprising a discharge capacitor adapted to be precharged to a predetermined voltage in response to a first transition of the digital input signal. A transistor switch of a first type is provided for precharging the discharge capacitor to a predetermined voltage. A discharge current source is connected via a sense node to the discharge capacitor for discharging the capacitor in response to a subsequent opposite transition of the digital input signal. A transistor switch of a second type is provided for connecting the discharge capacitor to the discharge current source and thereby discharging the discharge capacitor. A reference voltage source is provided for applying a reference voltage to a reference node. A comparator is provided having a first input connected to the sense node and a second input connected to the reference node, such that an output of the comparator generates a delayed version of the digital input signal such that the subsequent opposite transition is delayed by an amount equal to the time for the capacitor to discharge to a voltage equal to the reference voltage.

BRIEF DESCRIPTION OF THE DRAWINGS

A preferred embodiment of the present invention is described herein below with reference to the drawings in which.

DETAILED DESCRIPTION OF THE PREFERRED EMBODIMENT

Figure 1:
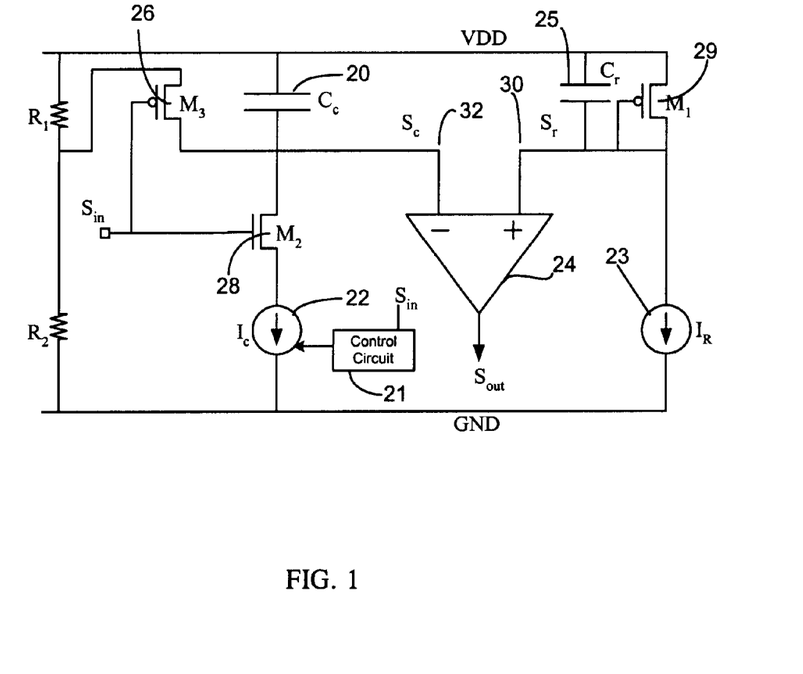
FIG. 1 is a schematic illustration of a programmable delay element according to an embodiment of the present invention.

Reference is first made to FIG. 1, which shows a schematic illustration of a programmable delay circuit (element). The delay circuit comprises a discharge capacitor 20 ($C_C$), a reference capacitor 25 ($C_r$) a resistive voltage divider formed by resistors R1 and R2 a programmable current source 22 ($I^C$), a reference current source 23 ($I_R$), a differential input comparator 24 and a control circuit 21. Capacitors $C_c$ and $C_r$ are implemented using native devices with low threshold voltage ($V_T$=−0.02 V). When the input signal (Sin) is low, switch 28 (M2) is off and the capacitor 20 is discharged through a switch 26 (M3) to a voltage established by a voltage divider comprising resistors R1 and R2. Although contrary to conventional meaning, in the present specification setting the capacitor 20 to the aforementioned predetermined voltage is referred to as "precharging" the capacitor. The voltage at node 30 ($S_r$) is set by the reference current $I_R$ and the active load 29 (M1). When the input signal (Sin) switches from low to high, switch 26 turns off and switch 28 turns on thereby connecting the programmable current source 22 for charging capacitor 20 through node 32 (Sc), such that the voltage on node $S_c$ drops toward ground. For the purpose of the present specification, charging the capacitor 20 in response to connecting the programmable current source 22 is referred to herein as "discharging" the capacitor. The voltage developed across the capacitor 20 is linearly proportional to the discharging time, according to the following formula.

$$\Delta V = \frac{I_c}{C_c} \times \Delta t$$

Figure 2:
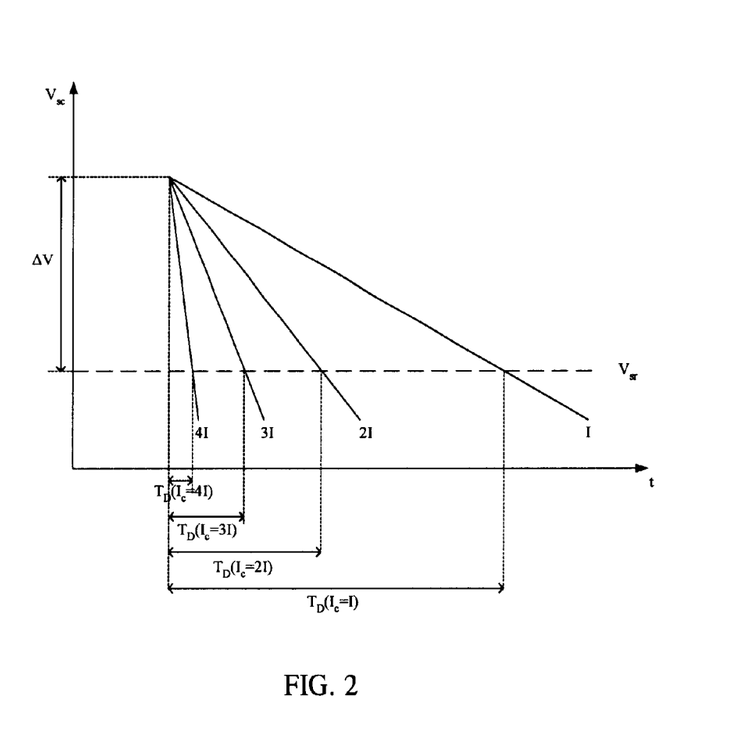
FIG. 2 is a graph of time delay in the programmable delay element of FIG. 1, based on a voltage drop in a discharge capacitor and dependent on current.

With reference to FIG. 2, the differential inputs of the comparator 24 sense the voltages for different discharging rates. It is clear that the discharge delay $T_D$ defined by the time interval where the capacitor voltage $V_{SC}$ drops from its initial precharged level to the reference level $V_{SR}$ is as follows.

$$T_D = \frac{\Delta V \times C_c}{I_c}$$

Hence, the discharge delay $T_D$ is inversely proportional to the controlling current $I_C$ from the programmable current source 22, as shown in FIG. 2. It is useful for some applications to define a step delay $T_S$ as a function of a unit current increase in the controlling current $I_C$.

$$T_S = T_{D2} - T_{D1} = \frac{(\Delta V \times C_c)(I_{c1} - I_{c2})}{I_{c1}I_{c2}}$$

For fixed and small unit increments of current, $I_U$, the step delay is approximated by the following formula.

$$T_S \approx \Delta V \times C_c \times \frac{I_U}{I_c^2}$$

Thus, the step delay $T_S$ is inversely proportional to the square of the controlling current $I_C^2$. Hence, the step delay $T_S$ becomes progressively smaller as the magnitude of the controlling current $I_C$ is increased. This non-linear behavior can be dealt with in the system firmware provided the step delay is sufficiently small under worst-case conditions. The small step delays ensure accuracy in the desired delay values.

Figure 3:
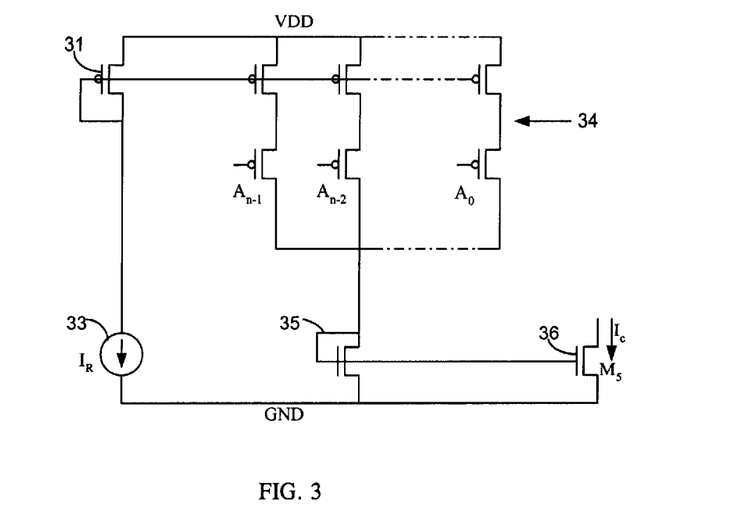
FIG. 3 is a schematic illustration of a programmable current source showing a number of current elements, for use in the programmable delay element of FIG. 1.

Referring now to FIGS. 1 and 3, the programmable current source 22 is shown comprising a source 33 of reference current $I_R$ and a PFET 31 configured to operate as a diode connected in parallel with a plurality of current elements 34 which, in turn, are connected in parallel between the supply rail (VDD) and an output gate comprising transistors 35 and 36. The reference current $I_R$ and the programmable current $I_C$ are obtained from an on-chip reference circuit (not shown). Accuracy of the value of the reference current is not critical since the delay is generated from differential voltage rather than an absolute value of the voltage. The reference current $I_R$ should be stable during the operation of the delay circuit in order to minimize jitter. A digital code $A_{n-1}A_{n-2} \ldots A_0$ is generated by the control circuit 21 (FIG. 1) for controlling the number of unit current elements 34 to be turned on in parallel. The diode connected PFET 31 along with transistor 36 (M5) mirrors the current of the unit elements 34 thereby forming a current sink. By fixing the size of transistor 36 (M5) and varying the current value by using the digital codes $A_{n-1}A_{n-2} \ldots A_0$, the parasitic capacitance contribution of M5 to the $S_C$ node is kept constant irrespective of the current. The control circuit 21 ensures that the digital codes are stable during the discharge period. The negative edge of the input signal $(S_{in})$, during which capacitor 20 ($C_c$) is precharged, is used to update the digital code to a new value, if required. This ensures that the digital code is updated only during the precharge and is stabilized prior to the discharge of $C_c$.

Figure 4:
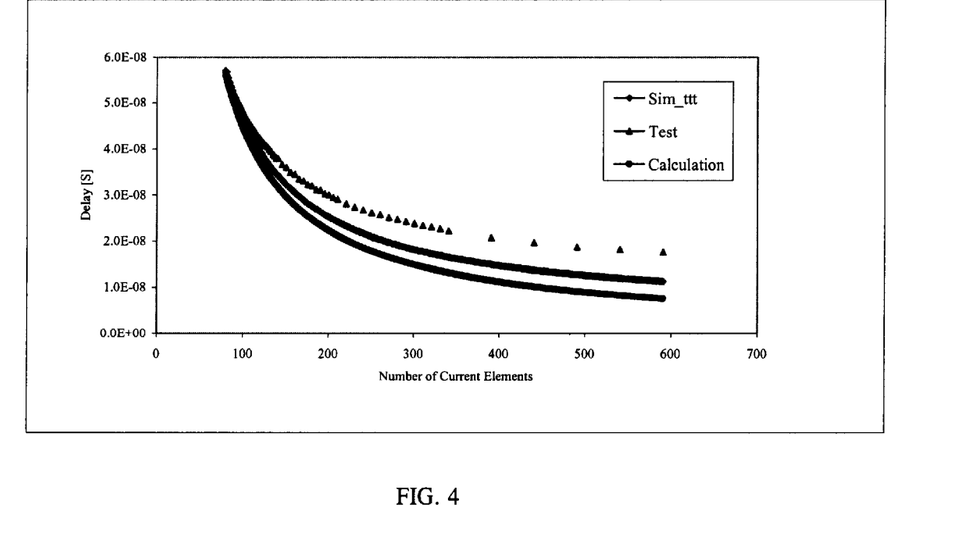
FIG. 4 is a graph of the time delay as a function of number of current elements of FIG. 3.

Reference is now made to FIG. 4, which shows a graph of the time delay of the present embodiment as a function of the number of current elements 34 in FIG. 3. By varying the controlling current $I_C$ from 100 $\mu$A, to 600 $\mu$A, a delay time range of 46.7 nS is achieved (from 58.1 nS to 11.4 nS). A measured delay range of 39.5 nS is considered to be in close agreement with the simulated time delay range under fast conditions (i.e. fast process variables, low temperature and high supply voltage). The initial delay in the measured characteristics is different from that of the simulated delay due to the additional digital logic employed before and after the delay element. The resulting curve is steeper in the wide delay range than in the narrow delay range. In the wide delay range each unit current element provides a step delay of 0.6 nS whereas in the narrow delay range each unit current element gives a step delay as fine as 11 pS. Thus the circuit of the present invention can provide both coarse and fine delay steps depending on the delay range. The robustness of the delay step is dependent on the absolute value of the current source. Thus, a very stable reference current is preferable.

The circuit of the present invention is less sensitive to temperature and voltage variations than the known prior art. Because only one reference current ($I_R$) is used to generate all other currents, any variation causing a change in the control current $I_C$ also results in a change in the reference current $I_R$ as the discharge rate changes the reference current $I_R$ in a similar manner. Any induced variations at the input of comparator 24 tend to cancel each other. Any transient noise on the power supply is also seen as a common mode signal to the comparator inputs since the discharge capacitor 20 ($C_C$) and the reference level capacitor 25 ($C_r$) are both of the same value and referenced to the same supply voltage (VDD).

Figure 5:
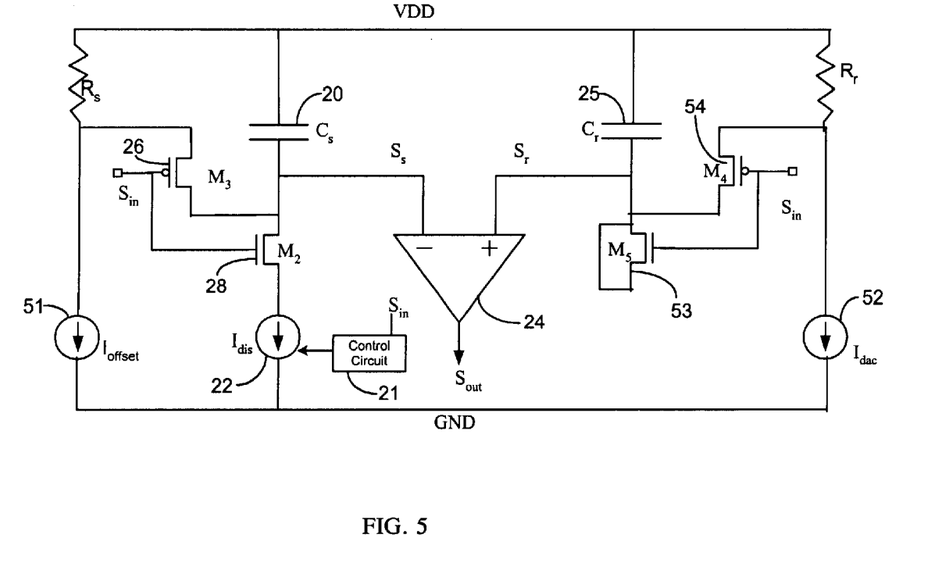
FIG. 5 is a schematic illustration of a programmable delay element according to another embodiment of the present invention.
Figure 6A:
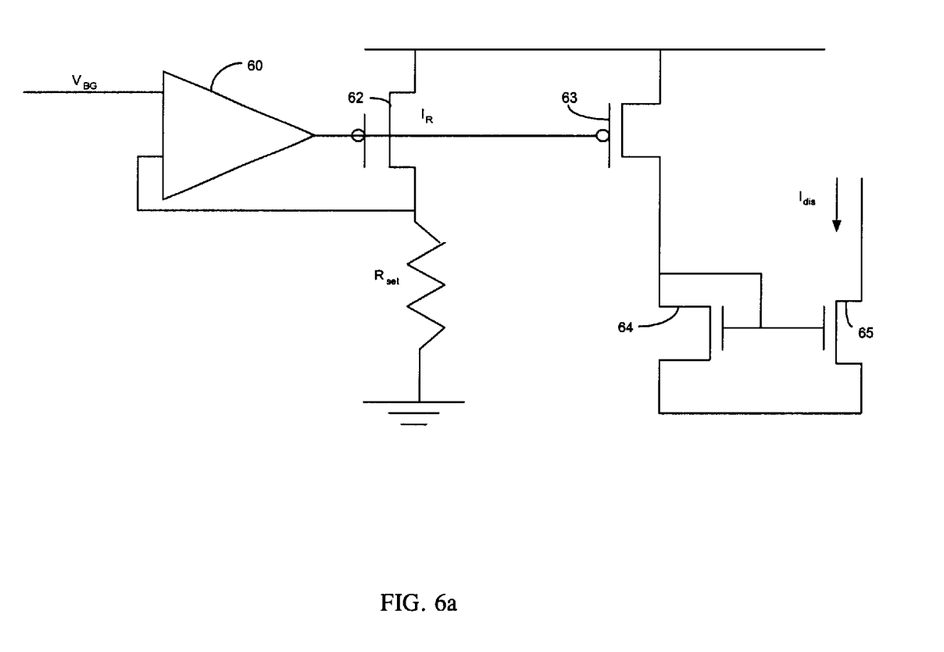
FIGS. 6a, 6b and 6c are schematic illustrations of circuits for generating Discharge Current and DAC current, respectively, in the embodiment of FIG. 5.
Figure 6B:
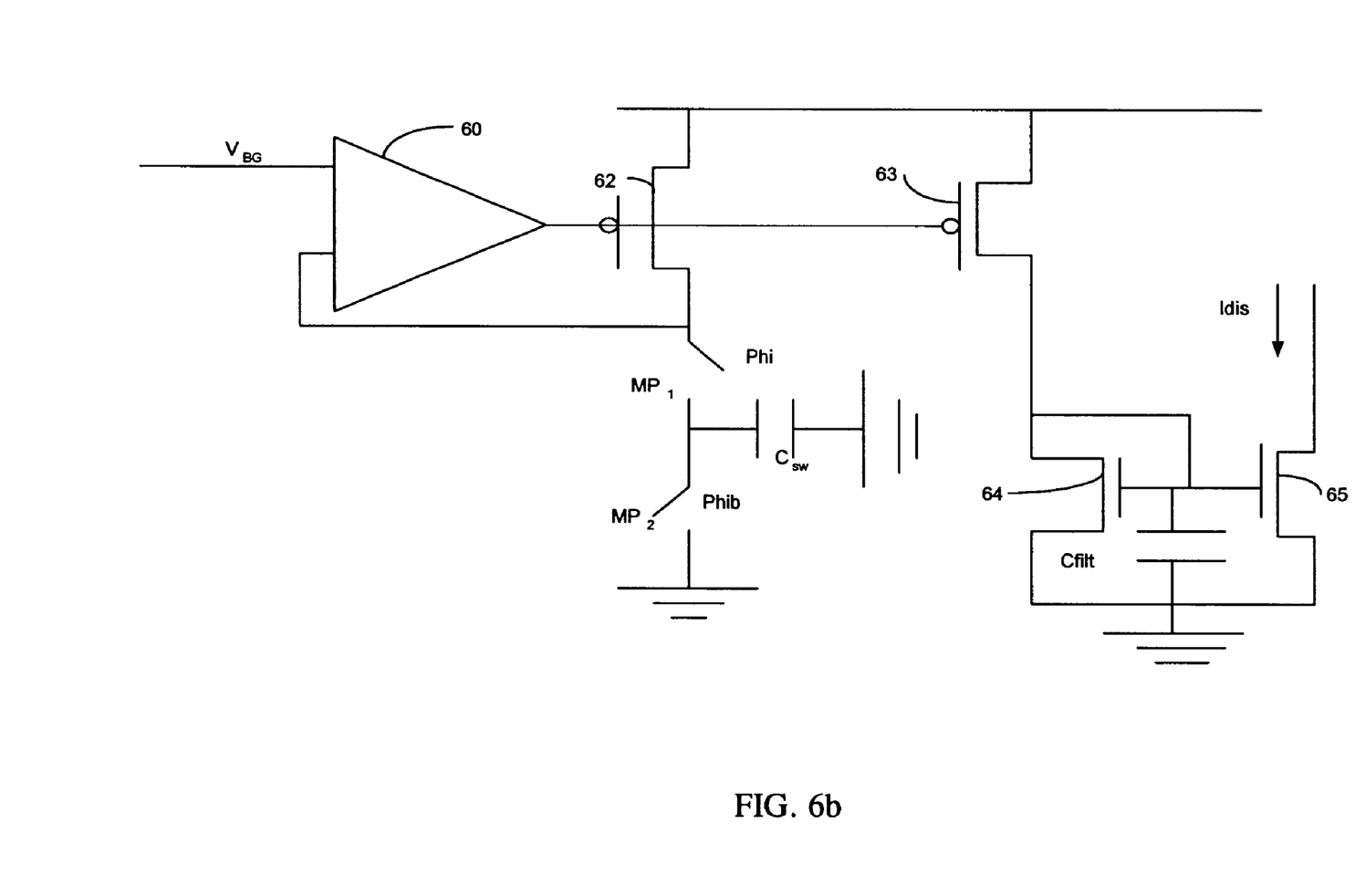
Figure 6C:
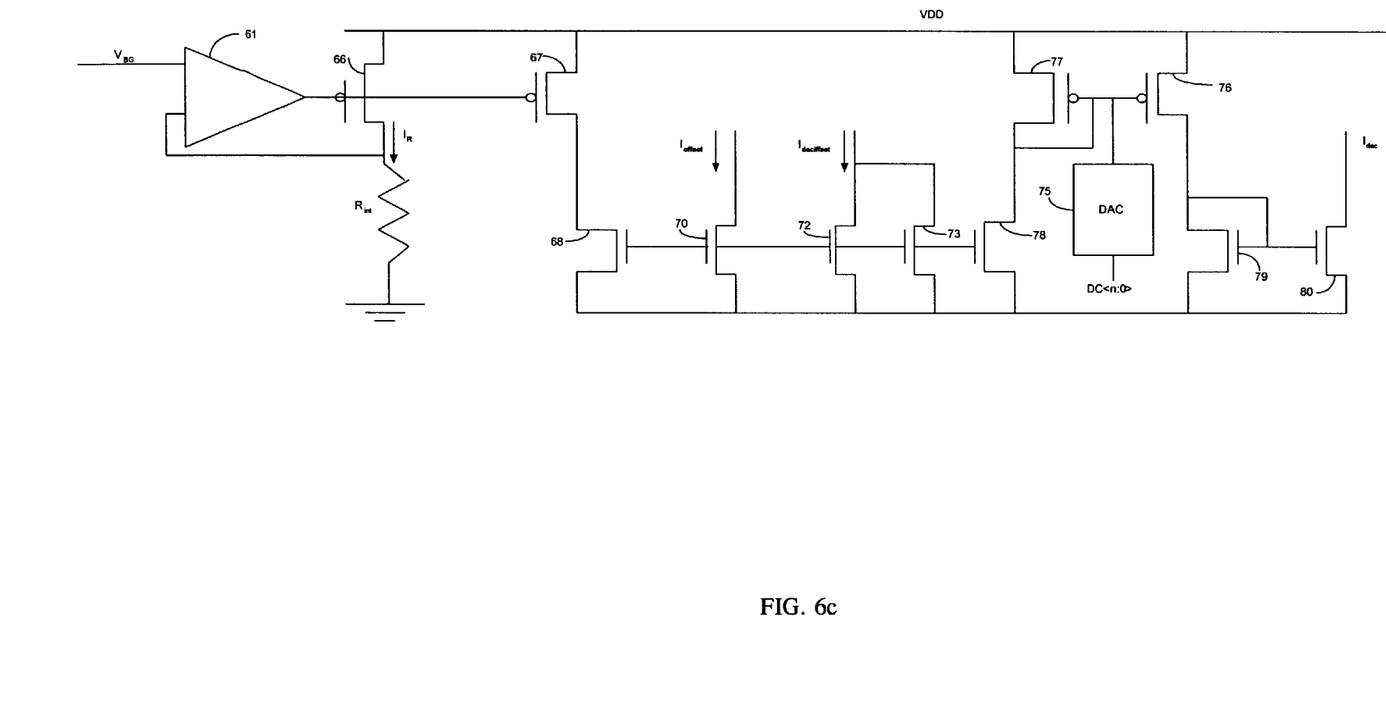

Reference is now made to FIGS. 5, 6a and 6c which shows a second embodiment of a programmable delay circuit according to the present invention. In this embodiment, the delay circuit is formed as illustrated in FIG. 5. The delay circuit in FIG. 5 comprises a discharge capacitor 20 ($C_s$), a reference capacitor 25 ($C_r$), a voltage divider formed by an offset current source 51 ($I_{offset}$) and resistor $R_s$ and another voltage divider formed by DAC current source 52 ($I_{dac}$) and resistor $R_r$. Capacitors $C_s$ and $C_r$ are implemented using native devices (i.e. transistors with low threshold voltage ($V_T$=−0.2)). When the input signal $S_{in}$ is low, switches 28 ($M_2$) and 53 ($M_5$) are off and capacitors 20 ($C_s$) and 25 ($C_r$) are "precharged" through switches 26 ($M_3$) and 54 ($M_4$). Switch 53 ($M_5$) compensates for charge injection and preserves matching on node $S_r$ with node $S_s$. Capacitor 20 ($C_s$) is precharged to a voltage higher than capacitor 25 ($C_r$) by providing $I_{offset}<I_{dacinitial}$ to guarantee the comparator output $S_{out}$ is in a known state. $I_{dacinitial}$ is a sum current of $I_{dacoffset}$ and initial DAC current. For canceling process dependencies $I_{dacoffset}$ and $I_{offset}$ are also generated based on internal resistor $R_{int}$ as illustrated in FIG. 6c. When the input signal $S_{in}$ switches from low to high, switches $M_3$ and $M_4$ turn off and switches $M_2$ and $M_5$ turn on. Switch $M_2$ connects the discharge current source 22 ($I_{dis}$) to the capacitor $C_s$ thereby "discharging" $C_s$ with a fixed discharge rate. The DAC current $I_{dac}$ is a variable current that provides a variable reference voltage by producing a voltage drop across resistor $R_r$. In this embodiment, having a constant value for the discharge current $I_{dis}$ provides a constant discharge rate for capacitor $C_s$ on node $S_s$. The voltage drop from the initial precharge level of $S_s$ to the reference voltage level on $S_r$ is given as:

$$\Delta V = (V_{Ssi} - \Delta I_{dac}R_r)$$

The delay $T_D$ defined by the time interval where the node voltage $V_{SS}$ drop from its initial precharged level to the variable reference level $V_{SR}$ is as follows:

$$T_D = \left[ \frac{V_{S_{si}} - \Delta I_{dac} R_r}{I_{dis}/C_s} \right]$$

In this embodiment the delay is directly proportional to the DAC current $I_{dac}$. Furthermore the delay step is constant irrespective of the value of the DAC current $I_{dac}$. This is an important feature of this embodiment of the present invention. The control circuit in FIG. 5 is used to ensure the digital codes are stable during the discharge period. The negative edge of the input signal $S_{in}$, during which the capacitor 20 ($C_s$) is precharged, is used to update the digital code to a new value, if required, to change the DAC current $I_{dac}$. This ensures that the digital code is updated only during the precharge and stabilized prior to the discharge of capacitor 20 ($C_s$).

Referring now to FIG. 6a and 6c in conjunction with FIG. 5 a reference current generation scheme is illustrated. The discharge current $I_{dis}$ is generated using a reference (i.e. band-gap) voltage $V_{BG}$ which is process, supply and temperature independent, an operational-amplifier 60 and a PFETs 62 and 63 whose gates are connected to the output of the amplifier 60. The drain tenninal of the PFET 62 is connected to a resistor $R_{SET}$ and to the second input of the amplifier 60. The drain terminal of PFET 63 is connected to transistors 64 and 65. The value of the discharge current $I_{dis}$ is given by:

$$I_{dis} = \frac{V_{BG}}{R_{SET}}$$

The resistor $R_{SET}$ is implemented can be implemented internal or external to the chip. However, in order to achieve delay with minimal dependence on process, temperature and supply variations $R_{SET}$ must be implemented external to the chip. In FIG. 6c, the current $I_R$ is generated using the same reference voltage, $V_{BG}$ and with an on-chip resistor $R_{int}$. This reference current $I_R$ is used in conjunction with program bits applied to a DAC 75 so as to vary the current $I_{dac}$, An operational-amplifier 61 has an output connected to the gates of PFETs 66 and 67. The drain terminal of the PFET 66 is connected to the resistor $R_{int}$ and to the second input of the amplifier 61. The drain terminal of PFET 67 is connected to transistor 68. The currents $I_{dacoffset}$ and $I_{offset}$ are derived from $I_R$ via transistors 70, 71 and 73. From FIG. 6c, it will be noted that the DAC current ($I_{dac}$) comprises the initial $I_{dacoffset}$ and a current that is varied by using a digital code that selectively turns on and turns off a plurality of unit current elements in a manner similar to that discussed above with reference to FIG. 3 (only one representative current element 76 being shown for clarity of the drawings). A diode-configured transistor 77 and further transistor 78 form a current sink, and the respective current elements 76 in turn, are connected in parallel between the supply rail (VDD) and an output gate comprising transistors 70 and 80 in a similar manner to the circuit of FIG. 3.

The current $I_{dac}$ is used to provide a variable reference voltage level by producing a drop across resistor $R_r$ connected to the supply voltage. The current $I_{dac}$ is based on the reference current $I_R$ generated by the on-chip resistor $R_{int}$ so as to produce a reference voltage across the matched resistor $R_r$. Generating the variable reference voltage on node $S_r$ using this scheme ensures that the reference voltage is independent of process, voltage and temperature. The only contribution to process dependence in the delay $T_D$ is from the process dependence of capacitor $C_s$, if $R_{SET}$ is implemented external to the chip. Consequently, according to this embodiment of the present invention delay is provided independently of any variations in operating conditions.

Reference is now made to FIG. 6b in conjunction with FIG. 5 to describe a third embodiment of a programmable delay circuit according to the present invention. In this embodiment, the delay circuit incorporates a different circuit to generate the discharge current $I_{dis}$ as illustrated in FIG. 6b, which uses similar reference numbers for similar components to the embodiment of FIG. 6a. The discharge current in this embodiment is also generated using the band-gap reference voltage $V_{BG}$ which is process, supply and temperature independent, operational-amplifier 60 and PFET 62 whose gate is connected to the output of the amplifier 60. The drain terminal of the PFET 62 is connected to a source of another PFET, MP1, whose gate is controlled by a clock signal Phi. The drain terminal of switch MP1 is connected to a capacitor, $C_{sw}$, formed by using a native device (i.e. a transistor with low threshold voltage ($V_T$=–0.2)). The drain and source terminals of the native device are shorted circuited to form a capacitor. The shorted drain and source terminals of $C_{sw}$ device are connected to ground. The gate of the native device is connected to the source terminal of a second switch MP2 whose gate is controlled by clock signal Phib. The drain terminal of the second switch MP2 is also connected to ground.

In this embodiment the discharge current $I_{dis}$ is generated using a closed loop configuration, using the band-gap voltage $V_{BG}$ and the switched capacitor $C_{SW}$. The switched capacitor realization generates the current $I_{dis}$ according to the following formula:

$$I_{dis} = V_{BG} \frac{C_{sw}}{T_{phi}}$$

The clocks (Phi & Phib) are opposite in phase and are preferably generated by a crystal. Thus, for example with a 24 MHz crystal and a 100 $\mu A$ current, a capacitance of 3.3 pF is required. The switching noise of the clock signal (Phi) is filtered from the generated current using a filtering capacitor ($C_{filt}$).

Referring now to FIGS. 5 and 6c, on the reference side, the current $I_R$ is generated from the same reference voltage, $V_{BG}$ but using an on-chip resistor $R_{int}$ instead of a switched capacitor. This reference current $I_R$ is used in conjunction with program bits applied to the DAC 75 so as to vary the current $I_{dac}$, as discussed in detail above. $I_{dacinitial}$ is a sum current of $I_{dacoffset}$ and the initial DAC current. For canceling process dependencies $I_{dacoffset}$ and $I_{offset}$ are also generated based on internal resistor $R_{int}$ as illustrated in FIG. 6c. As discussed above, the current $I_{dac}$ is used to provide a variable reference voltage level by producing a drop across the resistor $R_r$ connected to the supply voltage. Capacitor $C_s$ is connected in parallel between the resistor and the supply of the same type as the switch capacitor $C_{sw}$ discussed above. The discharge current is thus dependent on capacitor, $C_{sw}$, which is matched to capacitor $C_s$ on the sense node This makes the delay completely independent of process variation since any change in $C_{sw}$ is reflected in $I_{dis}$, and a similar change in $C_s$ will change the discharge rate thereby producing a delay that is independent of process as well as the operating conditions. For a practical realization, since the delay coverage is almost the same as the switch clock period, noise can appear on the discharge current. By using a filter capacitor ($C_{filt}$), the noise on the current is reduced to 1%. To further improve the noise, the crystal clock can be multiplied to a higher frequency such that the period of the new generated clock is less than the delay coverage required in order to ensure less current variation.

It will be appreciated that, although particular embodiments of the present invention have been described and illustrated in detail, various changes and modifications may be made. Binary weights can be used to arrange the unit current sources. Although great care is taken to ensure tight device matching the programmable current source does not guarantee monotonicity. A thermo-decoded implementation can be used to alleviate this problem. All such changes and modifications may be made without departing from the sphere and scope of the invention as defined by the claims appended hereto.

We claim:

1. A programmable delay element for delaying a digital input signal, comprising:
    a discharge capacitor being precharged to a predetermined voltage in response to a first transition of said digital input signal;
    a transistor switch of a first type precharging said discharge capacitor to said predetermined voltage;
    a discharge current source connected via a sense node to said discharge capacitor discharging said capacitor in response to a subsequent opposite transition of said digital input signal;
    a transistor switch of a second type connecting said discharge capacitor to said discharge current source and thereby discharging said discharge capacitor;
    a reference voltage source applying a reference voltage to a reference node; and
    a comparator having a first input connected to said sense node and a second input connected to said reference node, such that an output of said comparator generates a delayed version of said digital input signal wherein said subsequent opposite transition is delayed by an amount equal to a time for said capacitor to discharge to a voltage equal to said reference voltage.

2. The programmable delay element of claim 1, wherein said reference voltage is fixed and said discharge current source is programmable such that the time for said capacitor to discharge to said voltage equal to said reference voltage is inversely proportional to an amplitude of current generated by said discharge current source.

3. The programmable delay element of claim 2, wherein said programmable discharge current source further comprises a plurality of current elements, and respective control inputs receiving respective control bits of a digital code, the plurality of current elements are connected in parallel and selectively enabled and disabled by the respective control inputs.

4. The programmable delay element of claim 3, wherein said control bits of said digital code are updated in response to said first transition of said digital input signal such that said digital code is stabilized prior to said subsequent opposite transition of the digital input signal.

5. The programmable delay element of claim 1, further including a resistive divider connected between a source of supply voltage and ground producing a predetermined voltage level at an output thereof applied to one terminal of said transistor switch of the first type.

6. The programmable delay element of claim 1, wherein said reference voltage source comprises an additional transistor switch of said first type having one terminal connected to a source of supply voltage, a gate terminal being short circuited to a second terminal thereof, and a reference current source connected to said second terminal.

7. The programmable delay element of claim 1, wherein said discharge current source and said reference voltage source are derived from a single process, supply and temperature independent voltage source.

8. The programmable delay element of claim 1, wherein said reference voltage source comprises a reference capacitor whose characteristics are matched to said discharge capacitor.

9. A programmable delay element for delaying a digital input signal, comprising:
    a first voltage source generating a first predetermined voltage;
    a discharge capacitor being precharged to said first predetermined voltage;
    a first switch of a first type precharging said discharge capacitor to said first predetermined voltage via a sense node in response to a first transition of said digital input signal;
    a programmable reference voltage source generating a variable reference voltage;
    a reference capacitor being precharged to said variable reference voltage;
    a second switch of said first type precharging said reference capacitor to said variable reference voltage via a reference node in response to said first transition of said digital input signal;
    a discharge current source generating a fixed discharge current by applying a process, supply and temperature independent voltage across a first resistor;
    a first switch of a second type connecting said discharge capacitor to said discharge current source discharging said discharge capacitor in response to a subsequent opposite transition of said digital input signal; and
    a circuit having a first input connected to said sense node, a second input connected to said reference node, and an output generating a delayed version of said digital input signal wherein said subsequent opposite transition is delayed by an amount equal to a time for said discharge capacitor to discharge from said first predetermined voltage applied to said sense node to said variable reference voltage applied to said reference node.

10. The programmable delay element of claim 9, wherein respective reference resistors, each of the respective resistors having a first terminal connected to a source of supply voltage and second terminals connected to said first and second switches of the first type, are provided such that said sense node and said reference node are pre-charged to said first predetermined voltage and said variable reference voltage, respectively, by passing predetermined offset currents through said respective reference resistors.

11. The programmable delay element of claim 10, wherein each of the offset currents are generated by applying a process, supply and temperatures independent voltage across a further resistor whose characteristics are matched to said respective reference resistors.

12. The programmable delay element of claim 9, further comprising a second switch of said second type having a control terminal connected to said digital input signal, a second terminal connected to said reference node and a third terminal connected to said second terminal.

13. The programmable delay element of claim 9, wherein said reference voltage source further comprises a reference resistor and a programmable current source which passes a variable current through said resistor generating said variable reference voltage across said reference resistor.

14. The programmable delay element of claim 13 wherein said programmable current source further comprises a source of programmable reference current generated by a process, a supply and temperature independent voltage applied across a further resistor whose characteristics are matched to characteristics of said reference resistor.

15. The programmable delay element of claim 14, wherein said programmable discharge current source further comprises a plurality of current elements, and respective control inputs receiving respective control bits of a digital code, the plurality of current elements are connected in parallel and selectively enabled and disabled by the respective control inputs.

16. The programmable delay element of claim 15, wherein said control bits of said digital code are updated in response to said first transition of said digital input signal such that said digital code is stabilized prior to said subsequent opposite transition of the digital input signal.

17. A programmable delay element delaying a digital input signal, comprising:
 a first voltage source generating a first predetermined voltage;
 a discharge capacitor being precharged to said first predetermined voltage;
 a first switch of a first type precharging said discharge capacitor to said first predetermined voltage via a sense node in response to a first transition of said digital input signal;
 a programmable reference voltage source generating a variable reference voltage;
 a reference capacitor being precharged to said variable reference voltage;
 a second switch of said first type precharging said reference capacitor to said variable reference voltage via a reference node in response to said first transition of said digital input signal;
 a discharge current source generating a fixed discharge current by applying a process, supply and temperature independent voltage, to a further capacitor through a pair of switches whose control terminals are connected to opposite phase clock signals;
 a first switch of a second type connecting said discharge capacitor to said discharge current source for discharging said further capacitor in response to a subsequent opposite transition of said digital input signal; and
 a circuit having a first input connected to said sense node, a second input connected to said reference node, and an output generating a delayed version of said digital input signal wherein said subsequent opposite transition is delayed by an amount equal to a time for said discharge capacitor to discharge from said first predetermined voltage applied to said sense node to said variable reference voltage applied to said reference node.

18. The programmable delay element of claim 17, wherein respective reference resistors, each of the respective resistors having a first terminal connected to a source of supply voltage and second terminals connected to said first and second switches of the first type, are provided such that said sense node and said reference node are pre-charged to said first predetermined voltage and variable reference voltage, respectively, by passing predetermined offset currents through said respective reference resistors.

19. The programmable delay element of claim 18, wherein each of the offset currents are generated by applying a process, supply and temperature independent voltage across a further resistor whose characteristics are matched to said respective reference resistors.

20. The programmable delay element of claim 17, further comprising a second switch of said second type having a control terminal connected to said digital input signal, a second terminal connected to said reference node and a third terminal connected to said second terminal.

21. The programmable delay element of claim 17, wherein said reference voltage source further comprises a reference resistor and a programmable current source which passes a variable current through said resistor generating said variable reference voltage across said reference resistor.

22. The programmable delay element of claim 21, wherein said programmable current source further comprises a source of programmable reference current generated by a process, supply and temperature independent voltage applied across a further resistor whose characteristics are matched to characteristics of said reference resistor.

23. The programmable delay element of claim 22, wherein said programmable discharge current source further comprises a plurality of current elements, and respective control inputs receiving respective control bits of a digital code, the plurality of current elements are connected in parallel and selectively enabled and disabled by the respective control inputs.

24. The programmable, delay element of claim 23, wherein said control bits of said digital code are updated in response to said first transition of said digital input signal such that said digital code is stabilized prior to said subsequent opposite transition of the digital input signal.

25. The programmable delay element of claim 17, wherein said further capacitor is matched to said discharge capacitor.

26. The programmable delay element of claim 17, further including a filtering capacitor filtering switching noise from said discharge current resulting from said clock signals.

27. The programmable delay element of claim 17, wherein said clock signals are generated by a crystal oscillator.

28. The programmable delay element of claim 27, further comprising means for varying a frequency of said clock signals.

29. A programmable delay element delaying a digital input signal, comprising:
 a comparing circuit having a first input, a second input and an output;
 a programmable reference voltage source, connected to said first input of said comparing circuit, generating a variable reference voltage according to one reference current passing through an active load;
 a discharge capacitor, connected to said second input of said comparing circuit, precharged to a first voltage in response to a first transition of a digital input signal, wherein said discharge capacitor discharges to a second voltage less than the first voltage according to a programmable current source in response to a subsequent opposite transition of said digital input signal; and
 said output of the comparing circuit generating a delayed version of said digital input signal, wherein said subsequent opposite transition is time delayed by an amount of time equal to a time for said discharge capacitor to discharge from said first voltage to said variable reference voltage, and wherein the time delay is substantially immune to temperature variation and voltage variation of the comparing circuit.

30. The programmable delay element of claim 29, wherein respective reference resistors, each of the respective resistors having a first terminal connected to a source of supply voltage and second terminals connected to a first switch and second switch, are provided such that said first input and said second input are pre-charged to said first predetermined voltage and variable reference voltage, respectively, by passing predetermined offset currents through said respective reference resistors.

31. The programmable delay element of claim 29, further comprising:
   a second capacitor alternately connected between the discharge current source and a ground potential, wherein the alternating connection is controlled according to opposite phase clock signals.

32. The programmable delay element of claim 31, wherein respective reference resistors, each of the respective resistors having a first terminal connected to a source of supply voltage and second terminals connected to a first switch and second switch, are provided such that said first input and said second input are pre-charged to said first predetermined voltage and variable reference voltage, respectively, by passing predetermined offset currents through said respective reference resistors.

\* \* \* \* \*